(12) United States Patent
Arishima et al.

(10) Patent No.: US 6,713,200 B2
(45) Date of Patent: Mar. 30, 2004

(54) PELLICLE AND METHOD OF USING THE SAME

(75) Inventors: Hiroshi Arishima, Tokyo (JP); Shinya Kikugawa, Kanagawa (JP); Hitoshi Mishiro, Ibaraki (JP)

(73) Assignee: Asahi Glass Company, Limited, Tokyo (JP)

( * ) Notice: Subject to any disclaimer, the term of this patent is extended or adjusted under 35 U.S.C. 154(b) by 394 days.

(21) Appl. No.: 09/795,329

(22) Filed: Mar. 1, 2001

(65) Prior Publication Data

US 2002/0007907 A1 Jan. 24, 2002

(30) Foreign Application Priority Data

Jun. 1, 2000 (JP) ........................................ 2000-164473

(51) Int. Cl.7 ................................................. B32B 9/00
(52) U.S. Cl. ................ 428/702; 428/332; 428/336; 428/426; 428/446; 428/448; 428/689; 438/795; 438/800
(58) Field of Search ............................ 428/14, 220, 332, 428/336, 426, 446, 448, 688, 689, 702; 438/795, 800

(56) References Cited

U.S. PATENT DOCUMENTS

| | | | |
|---|---|---|---|
| 5,419,972 A | 5/1995 | Kawaguchi et al. | |
| 5,453,816 A | 9/1995 | Wang | |
| 5,531,857 A | 7/1996 | Engelsberg et al. | |
| 5,691,088 A | 11/1997 | Kubota et al. | |
| 6,197,454 B1 | * | 3/2001 | Yan |
| 6,340,541 B1 | * | 1/2002 | Yoo |

OTHER PUBLICATIONS

Abstract Only–JP08–160597.

Abstract Only–JP63–262651.

Abstract Only–JP01–265513.

XP–002245644, T.M. Bloomstein, et al., "Optical Materials and Coatings at 157 nm".

* cited by examiner

Primary Examiner—Deborah Jones
Assistant Examiner—Wendy Boss
(74) Attorney, Agent, or Firm—Oblon, Spivak, McClelland, Maier & Neustadt, P.C.

(57) ABSTRACT

A pellicle formed by bonding a pellicle membrane composed of synthesized glass on a pellicle frame by an adhesive wherein a light shielding member for shielding ultra-violet rays irradiated to the adhesive is provided at a portion where the pellicle membrane is bonded to the pellicle frame, whereby the adhesive for bonding the pellicle membrane to the pellicle frame is prevented from being deteriorated due to the irradiation of ultra-violet rays for cleaning.

18 Claims, 2 Drawing Sheets

PELLICLE AND METHOD OF USING THE SAME

The present invention relates to a pellicle used for manufacturing a semiconductor such as LSI, super LSI or the like or a liquid crystal display, and in particular, suitable for an exposure method in which light having a wavelength of substantially 220 nm is used.

In manufacturing a semiconductor such as LSI, super LSI or the like, or a liquid crystal display device, there has conventionally been conducted patterning by irradiating light having a wavelength of 240 nm or more to a semiconductor wafer or a liquid crystal display substrate through an original sheet to be exposed to light, e.g., a mask or a reticle (herein-below, referred simply to as an original sheet). In this case, if dust deposits on the surface of the original sheet on which the patterning is conducted, the dust will absorb, reflect or deflect light for exposure, whereby the dimensional accuracy and the quality are reduced and the outer appearance becomes poor. Therefore, working for exposing light has to be conducted in a clean room.

However, it is difficult to keep the original sheet clean.

For the purpose of preventing the deposition of dust on the original sheet, the work for exposing light is generally conducted by using a pellicle. FIG. 4 is a perspective view showing a conventional pellicle attached to an original sheet, and FIG. 5 is a cross-sectional view taken along a line A—A in FIG. 4. A pellicle 1 comprises a pellicle frame 5 and a pellicle membrane 2 for transmitting exposure light, which is bonded to an opening portion of the pellicle frame 5 by an adhesive 4. When working for exposing light is to be conducted, the pellicle 1 is attached to the original sheet 7 by bonding the pellicle frame 5 to it by an adhesive 6. The original sheet 7 attached with the pellicle 1 can be used semi-permanently unless the pellicle membrane 2 or the pellicle frame 5 is broken, because there is no possibility of a reduction of light transmittance or invasion of dust.

On the other hand, the wavelength of light for exposure used for manufacturing a semiconductor such as LSI, super LSI or the like has more and more been shortened according to a demand of minimizing the size, and at present, a technique of exposing light having a wavelength of 220 nm or less from an $F_2$ laser, is proposed. The original sheet used for such exposure may cause a reduction in transmittance of light by the deposition of an organic type gas existing in a clean room at the time of exposing light. Further, the original sheet is housed in a casing made of synthetic resin such as polyacrylate, polystyrene, polypropylene, polyethylene, polycarbonate, ABS resin or the like for the purpose of storage and transporting. It has been found that such casing generates an organic type gas, and the generated gas deposits on a surface of the housed original sheet to reduce its transmittance of light.

Therefore, in general, cleaning is conducted to the original sheet before the exposure to light. The inventors of this application proposed a technique of removing, as a cleaning method, in which ultra-violet rays such as $F_2$ laser or an $X_{e2}*$ excimer lamp (herein-below, referred to as "cleaning light") is irradiated to thereby decompose organic matters (PCT/JP00/01869). The pellicle membrane is, therefore, required to have a sufficient durability (light-resistance) to such cleaning light. Further, the adhesive 4 is also required to have light-resistance as well because the cleaning light is irradiated to the adhesive 4 for bonding the pellicle membrane 2 to the pellicle frame 5. In conventional technique, a polybutene resin, an acrylic resin, an epoxy resin type adhesive, a silicone type adhesive or the like is used as the adhesive 4. However, any adhesive material is not always sufficient in terms of light-resistance, and the bonding strength decreases with an increase of the number of times of irradiation of the cleaning light. As a result, there create problems that the pellicle membrane peels off from the pellicle frame to produce a gap whereby dust-proof ability becomes insufficient, and a deteriorated portion of the adhesive becomes dust, which deposits on the pattern-written surface of the original sheet 7 as dust.

The present invention has been achieved in view of the above-mentioned problems, and is to provide a pellicle capable of preventing the deterioration of an adhesive for bonding the pellicle membrane to the pellicle frame, due to exposure to cleaning light.

According to the present invention, there is provided a pellicle comprising a pellicle frame and a pellicle membrane composed of synthesized silica glass bonded to an opening of the pellicle frame by an adhesive, wherein a light shielding member for shielding ultra-violet rays irradiated to the adhesive is provided.

In the above-mentioned pellicle, it is preferable that the light shielding member is composed of a metal or a metal oxide. Further, it is preferable that the light shielding member is a membrane or a sheet having a thickness of 50 nm or more.

In the following, preferred embodiments of the pellicle according to the present invention will be described with reference to the drawings.

Figure 1:
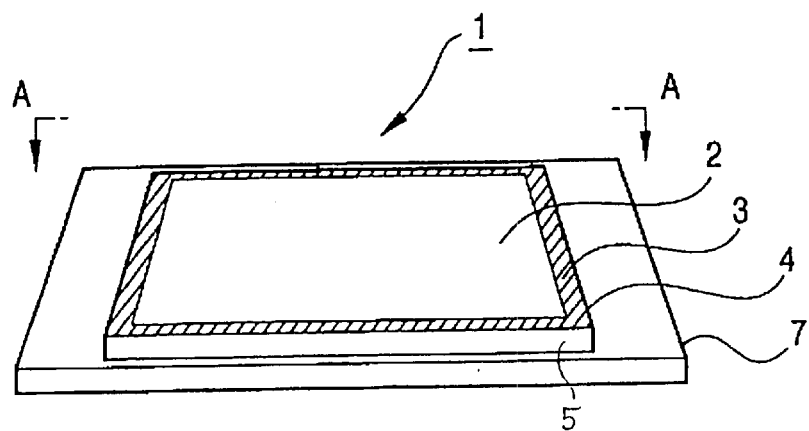
FIG. 1 is a perspective view of the pellicle according to a first embodiment of the present invention wherein the pellicle is attached to an original sheet.
Figure 2:
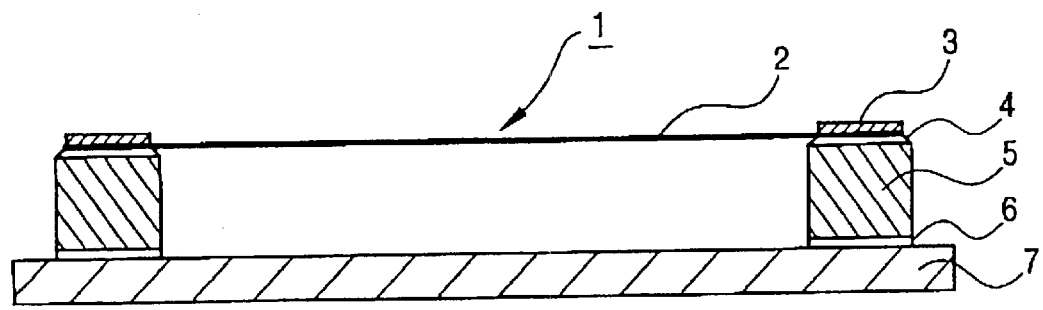
FIG. 2 is a cross-sectional view taken along a line A—A in FIG. 1.

FIGS. 1 and 2 show a first embodiment of the present invention.

In FIGS. 1 and 2, a pellicle 1 has such a basic construction that a pellicle membrane 2 is bonded to an opening portion of a pellicle frame 5 by adhesive 4. The pellicle membrane 2 is a thinned synthesized silica glass sheet so that it is suited for exposure to light having a wavelength of 220 nm or less. The synthesized silica glass is glass consists substantially of only silicon oxide which is obtained, for example, by growing a porous material composed of silicon oxide, called "soot", by reacting a silicon source and an oxygen source in a gaseous phase, followed by sintering. As the adhesive 4, polybutene resin, acrylic resin, epoxy resin, a silicon type adhesive or the like can be used in the same manner as in the conventional technique.

In addition to the above-mentioned basic construction of the pellicle 1 of the present invention, a light shielding member 3 is formed on the pellicle membrane 2 at a connecting portion between the pellicle membrane 2 and the pellicle frame 4. Namely, the light shielding member is formed to cover a portion where the adhesive 4 is applied. With respect to the light shielding member 3, although material therefore and the shape thereof are not in particular limited as long as it does not pass cleaning light, and has a sufficient light-resistance, a metal or a metal oxide formed into a film or a sheet can be used.

Although any kind of metal can be used, it is preferred to use chromium, aluminum, iron, copper or an alloy thereof from the viewpoints of light-resistance and light shielding properties. When a metallic sheet is to be formed, a metal or a metal alloy such as aluminum, iron or copper can be used because of allowing precise processing, and in particular, it is desirable to use aluminum having the same thermal expansion coefficient as the pellicle frame 4. In the present invention, the metallic sheet includes a metallic foil. Further, when a metallic oxide membrane is used, a membrane made of chromium oxide ($CrO_x$), silica ($SiO_2$), alumina ($Al_2O_3$) or the like is preferred from the reasons of light-resistance and light shielding properties. The thickness of the membrane, although it depends on a material to be used, should have sufficient light shielding properties, and is 50 nm or more, preferably, 50 nm–1000 nm, more preferably, 100 nm–1000 nm.

Figure 3:
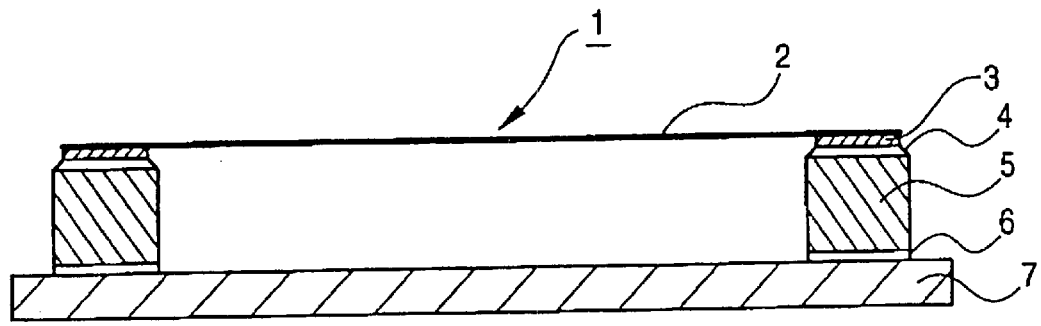
FIG. 3 is a cross-sectional view of the pellicle according to a second embodiment of the present invention, sectioned along a line A—A in FIG. 1.
Figure 4:
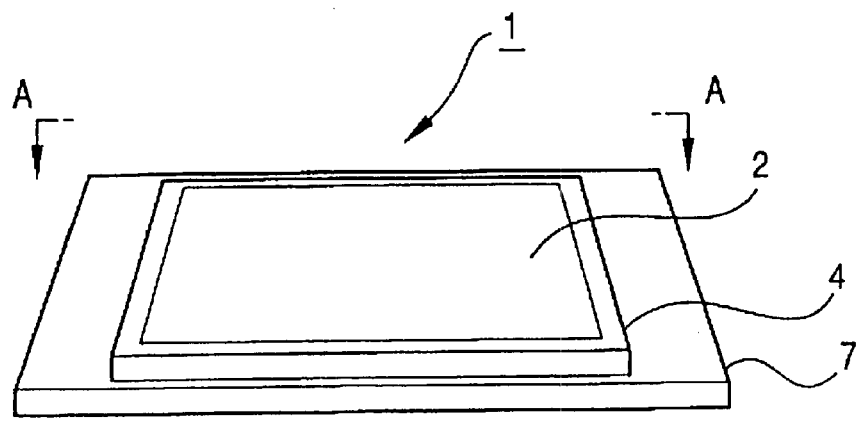
FIG. 4 is a perspective view of a conventional pellicle wherein the pellicle is attached to an original sheet.
Figure 5:
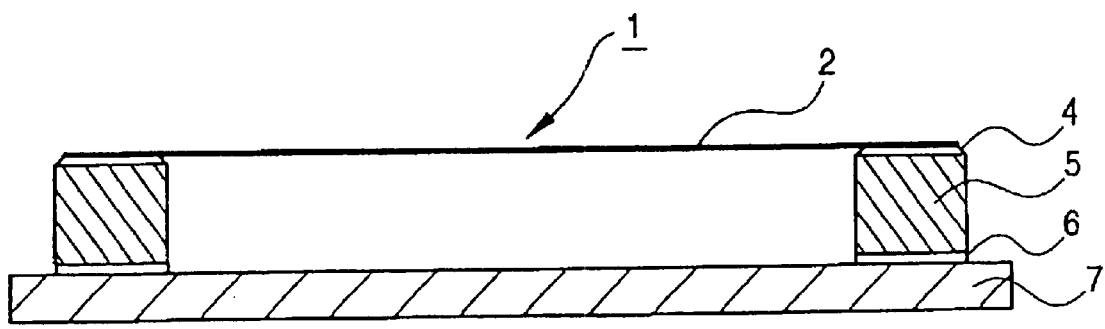
FIG. 5 is a cross-sectional view taken along a line A—A.

The light shielding member may be formed on the pellicle membrane 2 as shown in FIG. 2, or it may be provided between the pellicle membrane 2 and the pellicle frame 2 so as to cover the adhesive 4 as shown in FIG. 3.

In forming the above-mentioned metallic membrane or the metallic oxide membrane, a known method such as a sputtering method, a vapor deposition method, CVD method, a printing method or the like may be selected provided that the kind of material for the membrane and adhesion properties to the pellicle membrane should be considered. On the other hand, in the case of the metallic sheet, it can be fixed onto a surface of the pellicle membrane 2 or between the pellicle membrane 2 and the pellicle frame 5 by using a suitable adhesive.

The pellicle 1 is attached onto the original sheet 7 via an adhesive 6 applied to a lower surface of the pellicle frame 4 in the same manner as the conventional technique.

EXAMPLE

Now, the present invention will be described in detail with reference to Examples and Comparative Example. However, it should be understood that the present invention is by no means restricted by such specific Examples.

A pellicle A was prepared by using, as a pellicle membrane, a synthesized silica glass sheet polished to a thickness of 0.3 mm; bonding the pellicle membrane to a pellicle frame by a polybutene type adhesive, and forming a Cr film of 100 nm thick having the same width as the pellicle frame on a front surface of the synthesized silica glass sheet by sputtering (Example 1). Further, a pellicle B was prepared by forming a Cr film of 100 nm thick having the same width as the pellicle frame on a rear surface of a synthesized silica glass sheet having the same thickness by sputtering; applying a polybutene type adhesive on the Cr film, and bonding the Cr film to the pellicle frame (Example 2). Further, a pellicle C was prepared by attaching an aluminum foil subjected to a blacking treatment, instead of the Cr film used in the pellicle A (Example 3). Further, for comparison, a pellicle D was prepared by using a synthesized silica glass sheet of the same kind and bonding the sheet on a pellicle frame by using a polybutene type adhesive (Comparative Example).

Then, the pellicles A–D were respectively attached to each original sheet in a clean room. The number of foreign matters (e.g. dust) on the original sheet was measured by PI-1000 (manufactured by QC Optics, U.S.A.). Thereafter, light from a $X_{e2}*$ excimer lamp (UER-172 made by Usio Inc.) was irradiated for 60 min. from a side of the pellicle. After the irradiation, the original sheets were put into and fixed to casings respectively. The casings were dropped from a height of 60 cm, and the original sheets were taken out from the casings. Foreign matters on the surface of the original sheets were measured by using PI-1000. Table 1 shows amounts of deposition of the foreign matters before the irradiation and amounts of deposition of the foreign matters after the dropping.

TABLE 1

|  |  | Comparative Example 1 | Example 1 | Example 2 | Example 3 |
|---|---|---|---|---|---|
| Light shielding member |  | None | Cr 100 nm | Cr 100 nm | Aluminum |
| Amount of foreign matters | Before irradiation | 4.6 number/ surface | 5.2 number/ surface | 4.3 number/ surface | 6.2 number/ surface |
|  | After Irradiation | 121 number/ surface | 7.9 number/ surface | 7.3 number/ surface | 12.2 number/ surface |

It is found in Table 1 that the pellicles with the light shielding member of the present invention exhibit few occurrence of foreign matters due to the deterioration of the adhesive and have high durability to the cleaning light.

As described above, according to the present invention, the provision of the light shielding member prevents (1) the deterioration of the adhesive for bonding the pellicle membrane to the pellicle frame, the deterioration being caused by the cleaning light, (2) the deposition of foreign matters resulted from the deteriorated adhesive on the original sheet, and (3) the peeling-off of the pellicle membrane. Accordingly, the performance of the pellicle can be maintained desirably for a long period of time. Such deterioration-preventing effect to the adhesive provides a remarkable effect, in particular, in a technique using the exposure of light having a wavelength of 220 nm or less, which will become a main stream in a fine processing technique.

The entire disclosure of Japanese Patent Application JP2000-164473 filed on Jun. 1, 2000 including specification, claims, drawings and summary are incorporated herein by reference in its entirety.

What is claimed is:

1. A pellicle, comprising:
   a pellicle frame; and
   a pellicle membrane comprising synthesized silica glass bonded to an opening portion of the pellicle frame by an adhesive; and
   an ultra-violet light shielding member;
   wherein the light shielding member is provided on a front surface of the pellicle membrane.

2. The pellicle according to claim 1, wherein the light shielding member comprises a metal or a metal oxide.

3. The pellicle according to claim 2, wherein the light shielding member comprises at least one metal selected from the group consisting of chromium, aluminum, iron, copper and an alloy thereof.

4. The pellicle according to claim 2, wherein the light shielding member comprises at least one metal oxide selected from the group consisting of chromium oxide, silica and alumina.

5. The pellicle according to claim 1, wherein the light shielding member is a membrane or a sheet having a thickness of 50 nm or more.

6. A method of using a pellicle, comprising:
   irradiating ultra-violet rays to a surface of the pellicle membrane of the pellicle according to claim 1, before the pellicle is used for exposing light to an original sheet.

7. The method according to claim 6, wherein the wavelength of the ultra-violet rays is 220 nm or less.

8. The method according to claim 6, wherein the ultra-violet rays are an irradiated light from an excimer lamp or a $F_2$ laser.

9. The pellicle according to claim 1, wherein said light shielding member shields ultra-violet rays irradiated to the adhesive.

10. A pellicle, comprising:

a pellicle frame; and a pellicle membrane comprising synthesized silica glass bonded to an opening portion of the pellicle frame by an adhesive; and an ultra-violet light shielding member;

wherein the light shielding member is provided between the pellicle frame and the pellicle membrane.

11. The pellicle according to claim 10, wherein the light shielding member comprises a metal or a metal oxide.

12. The pellicle according to claim 11, wherein the light shielding member comprises at least one metal selected from the group consisting of chromium, aluminum, iron, copper and an alloy thereof.

13. The pellicle according to claim 11, wherein the light shielding member comprises at least one metal oxide selected from the group consisting of chromium oxide, silica and alumina.

14. The pellicle according to claim 10, wherein the light shielding member is a membrane or a sheet having a thickness of 50 nm or more.

15. A method of using a pellicle, comprising:

irradiating ultra-violet rays to a surface of the pellicle membrane of the pellicle according to claim 10, before the pellicle is used for exposing light to an original sheet.

16. The method according to claim 15, wherein the wavelength of the ultra-violet rays is 220 nm or less.

17. The method according to claim 15, wherein the ultra-violet rays are an irradiated light from an excimer lamp or a $F_2$ laser.

18. The pellicle according to claim 15, wherein said light shielding member shields ultra-violet rays irradiated to the adhesive.

* * * * *